United States Patent
Dix

(10) Patent No.: US 9,093,433 B2
(45) Date of Patent: Jul. 28, 2015

(54) USING BUMP BONDING TO DISTRIBUTE CURRENT FLOW ON A SEMICONDUCTOR POWER DEVICE

(75) Inventor: Gregory Dix, Tempe, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 719 days.

(21) Appl. No.: 13/288,108

(22) Filed: Nov. 3, 2011

(65) Prior Publication Data

US 2012/0126406 A1    May 24, 2012

Related U.S. Application Data

(60) Provisional application No. 61/414,991, filed on Nov. 18, 2010.

(51) Int. Cl.
| | |
|---|---|
| *H01L 23/482* | (2006.01) |
| *H01L 23/495* | (2006.01) |
| *H01L 23/00* | (2006.01) |
| *H01L 29/417* | (2006.01) |
| *H01L 29/423* | (2006.01) |
| *H01L 29/78* | (2006.01) |

(52) U.S. Cl.
CPC ...... *H01L 23/4824* (2013.01); *H01L 23/49562* (2013.01); *H01L 23/49575* (2013.01); *H01L 24/48* (2013.01); *H01L 24/49* (2013.01); *H01L 29/41758* (2013.01); *H01L 29/4238* (2013.01); *H01L 29/7816* (2013.01); *H01L 2224/16245* (2013.01); *H01L 2224/48247* (2013.01); *H01L 2224/49173* (2013.01); *H01L 2224/49175* (2013.01); *H01L 2224/49177* (2013.01); *H01L 2924/1305* (2013.01)

(58) Field of Classification Search
CPC ............................ H01L 23/4824; H01L 24/14
USPC .......................................... 257/737, 738, 778
See application file for complete search history.

(56) References Cited

U.S. PATENT DOCUMENTS

| | | | | |
|---|---|---|---|---|
| 6,166,436 | A  | 12/2000 | Maeda et al. ................. | 257/723 |
| 6,927,491 | B1* | 8/2005 | Yamada ....................... | 257/737 |
| 7,405,469 | B2* | 7/2008 | Kagii et al. .................. | 257/676 |
| 7,592,791 | B2* | 9/2009 | Emira .......................... | 323/283 |
| 7,999,364 | B2* | 8/2011 | Jiang ............................ | 257/676 |
| 2002/0125043 | A1* | 9/2002 | Yoshida ....................... | 174/261 |
| 2004/0227163 | A1* | 11/2004 | Sakamoto et al. ............ | 257/207 |
| 2004/0245638 | A1 | 12/2004 | Nemtsev et al. .............. | 257/758 |
| 2005/0230746 | A1* | 10/2005 | Eden et al. .................... | 257/330 |
| 2008/0035959 | A1* | 2/2008 | Jiang ............................ | 257/204 |

(Continued)

OTHER PUBLICATIONS

Gupta, D. "A Novel Active Area Bumped Flip Chip Technology for Convergent Heat Transfer from Gallium Arsenide Power Devices", 5 pages, Mar. 18, 1995.

(Continued)

*Primary Examiner* — Joseph C Nicely
(74) *Attorney, Agent, or Firm* — Slayden Grubert Beard PLLC

(57) ABSTRACT

A semiconductor power chip may have a semiconductor die having a power device fabricated on a substrate thereof, wherein the power device has at least one first contact element, a plurality of second contact elements and a plurality of third contact elements arranged on top of the semiconductor die; a plurality of ball bumps or a loaf bump disposed on each of the plurality of second elements and the plurality of third elements; and at least one ball bump or loaf on the at least one first contact element.

37 Claims, 8 Drawing Sheets

(56) References Cited

U.S. PATENT DOCUMENTS

| | | | |
|---|---|---|---|
| 2009/0174047 A1* | 7/2009 | Irving et al. | 257/676 |
| 2009/0179265 A1* | 7/2009 | Harnden et al. | 257/341 |
| 2010/0289092 A1* | 11/2010 | Perng et al. | 257/401 |
| 2011/0109287 A1 | 5/2011 | Nakamura et al. | 323/282 |
| 2011/0198611 A1 | 8/2011 | Cheah et al. | 257/76 |
| 2012/0104580 A1* | 5/2012 | Feng et al. | 257/673 |

OTHER PUBLICATIONS

International PCT Search Report and Written Opinion, PCT/US2011/060909, 16 pages, Mailed Feb. 1, 2012.

* cited by examiner

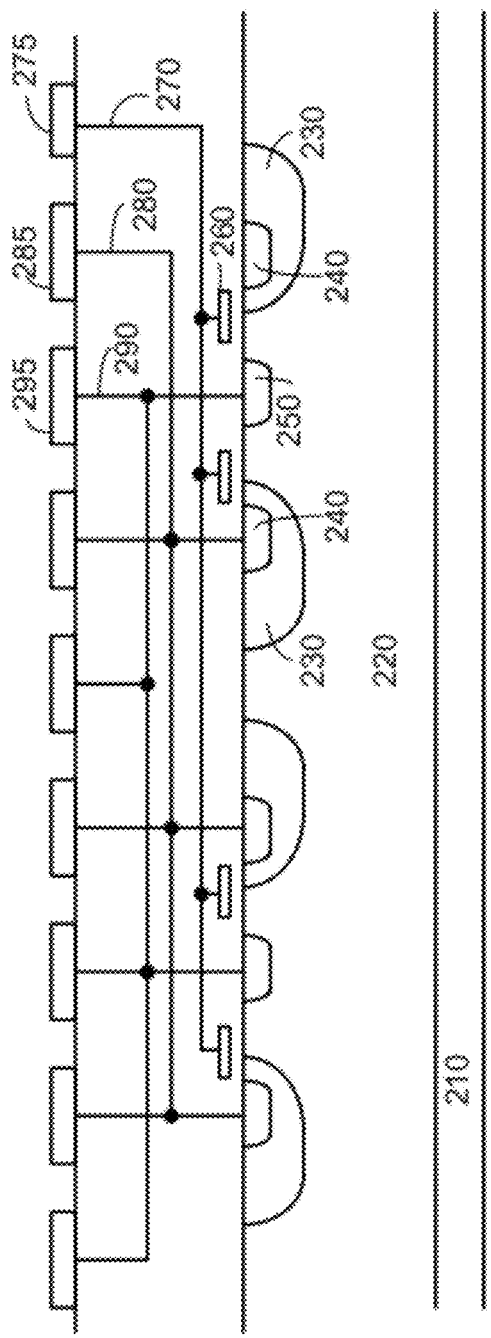

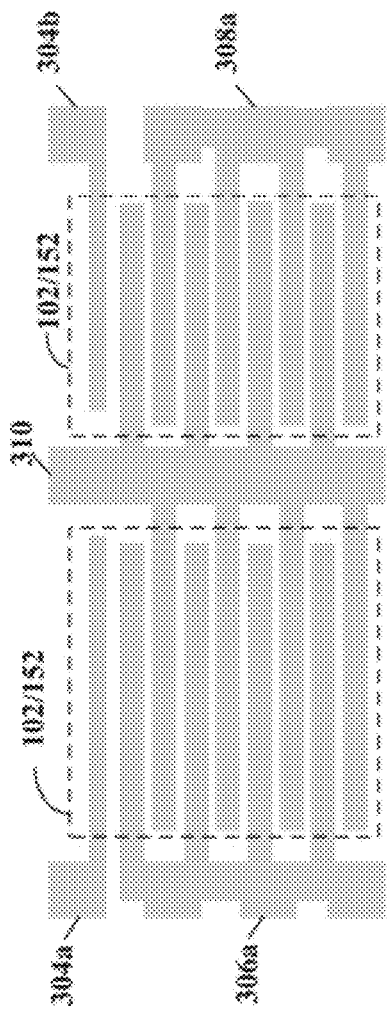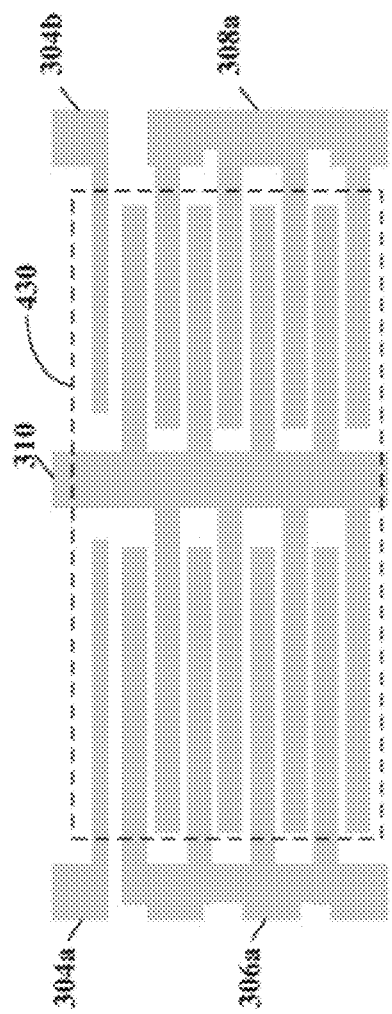
Figure 5A
Figure 5B

USING BUMP BONDING TO DISTRIBUTE CURRENT FLOW ON A SEMICONDUCTOR POWER DEVICE

CROSS-REFERENCE TO RELATED APPLICATIONS

This application claims the benefit of U.S. Provisional Application No. 61/414,991 filed on Nov. 18, 2010, entitled "USING BUMP BONDING TO DISTRIBUTE CURRENT FLOW ON A SEMICONDUCTOR POWER DEVICE", which is incorporated herein in its entirety.

TECHNICAL FIELD

The present disclosure relates to semiconductor power devices, and more particularly, to fabrication of a semiconductor power device to a lead-frame using bump bonding to distribute current between the lead-frame and the source, drain and gate elements of the semiconductor power device.

BACKGROUND

Semiconductor power devices operate at high current densities, and as such, require current carrying conductors having low enough contact resistances to adequately handle the current to and from the device. There are limitations, however, for metal deposition thickness during fabrication of the semiconductor power device. This metal deposition thickness limitation necessitates having to deposit metal conductors on both the front and back sides of the semiconductor power device, e.g., power field effect transistor (power-FET). But having to use back side contact of the power element(s) of the device, e.g., drain requires extensive processing to eliminate the series resistance of the semiconductor substrate, thereby adding significant cost to the final semiconductor power product.

SUMMARY

Therefore, it is desired reduce processing steps in manufacturing a semiconductor power device, and thereby reduce manufacturing costs thereof.

According to an embodiment, a semiconductor power chip may comprise a semiconductor die having a power device fabricated on a substrate thereof, wherein the power device comprises at least one first contact element, a plurality of second contact elements and a plurality of third contact elements arranged on top of said semiconductor die; a plurality of ball bumps or a loaf bump disposed on each of the plurality of second elements and the plurality of third elements; and at least one ball bump or loaf on the at least one first contact element.

According to a further embodiment, the first contact element is a gate contact element, the second contact element is a source contact element, and the third contact element is a drain contact element. According to a further embodiment, the plurality of ball bumps are joined to form a single loaf bump. According to a further embodiment, each contact element has the form of an elongated strip. According to a further embodiment, the semiconductor power chip may further comprise a plurality of first contact elements wherein each first contact element comprises a plurality of ball bumps. According to a further embodiment, the semiconductor power chip may further comprise a plurality of first contact elements wherein each first contact element comprises a loaf bump extending substantially along the first contact element.

According to another embodiment, a semiconductor power device may comprising a semiconductor power chip as described above and further comprise a lead-frame having an area comprising gate, source and drain lead-fingers adapted to match up with the plurality of ball bumps or the loaf bump for connecting to each of the at least one gate contact element, the plurality of source contact elements and the plurality of drain contact elements.

According to a further embodiment of the semiconductor power device, each lead finger may have the form of an elongated strip. According to a further embodiment of the semiconductor power device, the leadframe further may comprise left and right connection elements that interconnect the drain and source lead fingers, respectively. According to a further embodiment of the semiconductor power device, the drain and source lead fingers can be arranged alternatively to form a inter-digital structure. According to a further embodiment of the semiconductor power device, the semiconductor power device may further comprise a plurality of ball bumps disposed on the at least one gate contact element. According to a further embodiment of the semiconductor power device, the semiconductor power device may further comprise a loaf bump disposed on the at least one gate contact element.

According to another embodiment, a semiconductor power device may comprise at least a first and second semiconductor power chip, each semiconductor power chip being formed as described above, and may further comprise a lead-frame having an first and second area each first and second area comprising gate, source and drain lead-fingers adapted to match up with the plurality of ball bumps or the loaf bump for connecting to each of the at least one gate contact element, the plurality of source contact elements and the plurality of drain contact elements of said first and second semiconductor chips, respectively.

According to a further embodiment of the semiconductor power device, each lead finger may have the form of an elongated strip. According to a further embodiment of the semiconductor power device, the leadframe may further comprise left and right connection elements for each of said first and second power semiconductor chips that interconnect the drain and source lead fingers, respectively. According to a further embodiment of the semiconductor power device, the drain and source lead fingers may be arranged alternatively to form a inter-digital structure. According to a further embodiment of the semiconductor power device, the lead-frame may also connect together a source of said first semiconductor chip and a drain of said second semiconductor chip. According to a further embodiment of the semiconductor power device, the semiconductor power device may further comprise a plurality of ball bumps disposed on the at least one gate contact element. According to a further embodiment of the semiconductor power device, the semiconductor power device may further comprise a loaf bump disposed on the at least one gate contact element.

According to yet another embodiment, a semiconductor device may comprise a semiconductor power chip as described above, and further comprise another chip; a lead-frame having a first area comprising gate, source and drain lead-fingers adapted to match up with the plurality of ball bumps or loaf bumps for connecting to each of the at least one gate contact element, the plurality of source contact elements and the plurality of drain contact elements of the semiconductor power chip and a second area configured for wire bonding said another chip.

According to a further embodiment of the semiconductor power device, each lead finger may have the form of an elongated strip. According to a further embodiment of the semiconductor power device, the leadframe may further comprise left and right connection elements that interconnect the drain and source lead fingers, respectively. According to a further embodiment of the semiconductor power device, the drain and source lead fingers can be arranged alternatively to form a inter-digital structure. According to a further embodiment of the semiconductor power device, the semiconductor device may further comprise a plurality of ball bumps or a loaf bump disposed on the at least one gate contact element. According to a further embodiment of the semiconductor power device, the another chip can be a microcontroller chip operable to control said semiconductor power chip. According to a further embodiment of the semiconductor power device, the another chip can be a pulse width modulation chip operable to control said semiconductor power chip.

According to yet another embodiment, a semiconductor device may comprise at least a first and second semiconductor power chip, each semiconductor power chip being formed as described above, and further comprise a third chip; a lead-frame having an first and second area each first and second area comprising gate, source and drain lead-fingers adapted to match up with the plurality of ball bumps or the loaf bumps for connecting to each of the at least one gate contact element, the plurality of source contact elements and the plurality of drain contact elements of said first and second semiconductor chips, respectively and a third area configured for wire bonding said another chip.

According to a further embodiment of the semiconductor power device, each lead finger for said first and second semiconductor power chip may have the form of an elongated strip. According to a further embodiment of the semiconductor power device, the leadframe may further comprise for each of said first and second semiconductor power chips left and right connection elements that interconnect the drain and source lead fingers, respectively. According to a further embodiment of the semiconductor power device, the drain and source lead fingers can be arranged alternatively to form a inter-digital structure. According to a further embodiment of the semiconductor power device, the semiconductor device may further comprise a plurality of ball bumps or a loaf bump disposed on the at least one gate contact element. According to a further embodiment of the semiconductor power device, the third chip can be a microcontroller chip operable to control said semiconductor power chip. According to a further embodiment of the semiconductor power device, the third chip can be a pulse width modulation chip operable to control said semiconductor power chip.

According to yet another embodiment, a semiconductor power chip may comprise a semiconductor die having a power device fabricated on a substrate thereof, wherein the power device comprises at least one first contact element, a plurality of second contact elements and a plurality of third contact elements arranged on top of said semiconductor die; a plurality of loaf bumps, each loaf bump disposed on one of the plurality of second elements and on one of the plurality of third elements; wherein the loaf bumps for the second contact elements extend towards one side of the semiconductor die and are joined by a first loaf side structure and the loaf bumps for the third contact elements extend towards the other side of the semiconductor die and are joined by a second loaf side structure; at least one ball bump or loaf on the at least one first contact element.

According to a further embodiment of the above semiconductor power chip, the first contact element is a gate contact element, the second contact element is a source contact element, and the third contact element is a drain contact element.

According to yet another embodiment, a semiconductor power device may comprise a semiconductor power chip as described above, and further comprise a lead-frame having a first area for contact with the first contact element, a second area for contact with the first loaf side structure and a third area for contact with the second loaf side structure. According to a further embodiment of the semiconductor power device, the leadframe does not substantially cover the second and third contact elements.

BRIEF DESCRIPTION OF THE DRAWINGS

A more complete understanding of the present disclosure thereof may be acquired by referring to the following description taken in conjunction with the accompanying drawings wherein:

FIG. 3 shows a cross-section view along the line 2-2 in FIG. 1;

FIG. 5A-C show top views of various leadframe structures with mounted semiconductor chips according to various embodiments;

Figure 1:
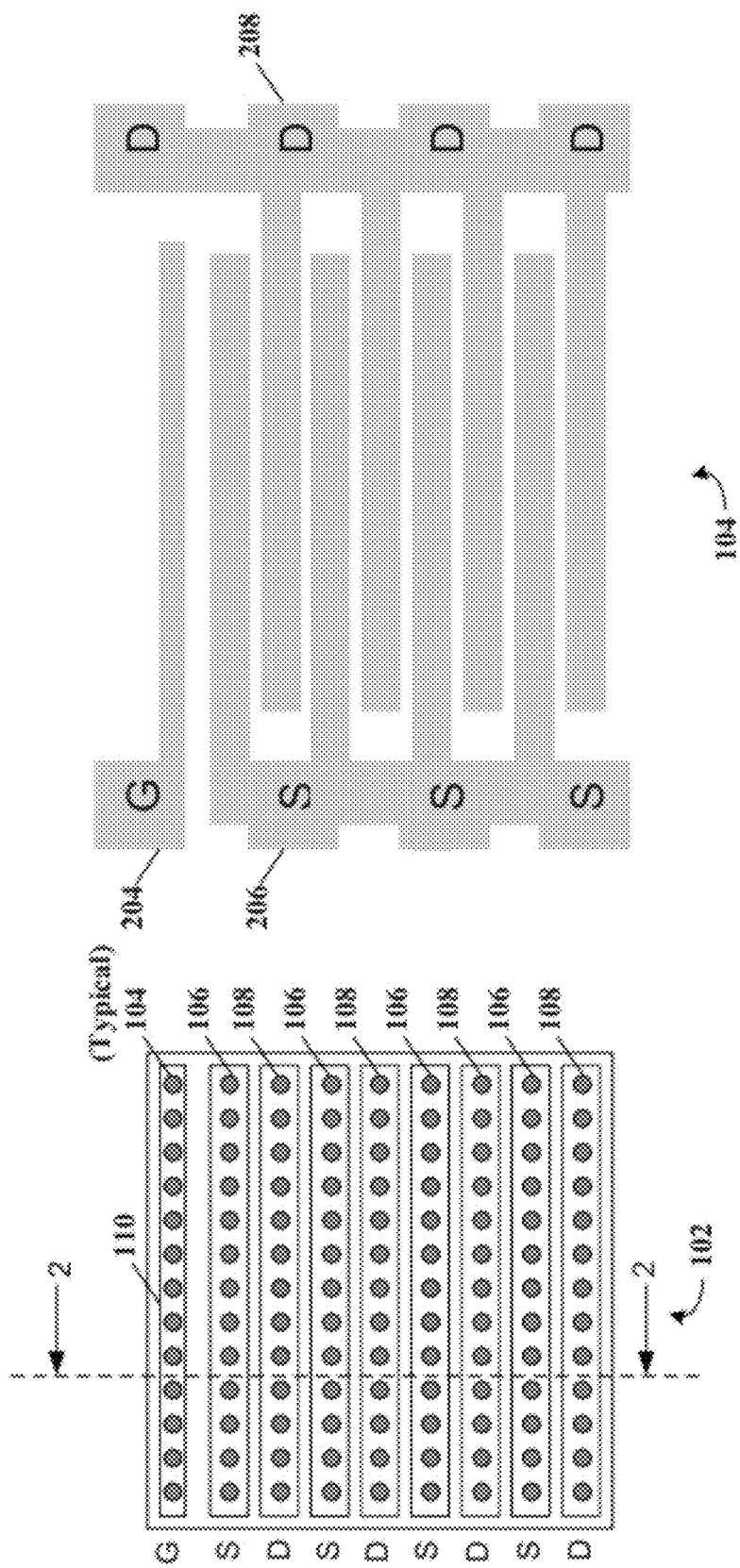
FIG. 1 illustrates a schematic plan view of a semiconductor power device and a plan view of a lead-frame, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to the teachings of this disclosure, using a bump or loaf array to distribute the current between elements of the semiconductor power device and a much thicker lead-frame eliminates the need for a separate backside contact and subsequent processing step(s). The bump or loaf array may comprise a single loaf bump or a plurality of ball bumps arranged in a "bump loaf" configuration on each of the semiconductor elements. The semiconductor power device may then be attached to a lead-frame using flip-chip ball bond techniques. This results in lower processing and manufacturing costs, and a smaller form-factor for the semiconductor power device. Low resistance substrates are not needed and an epitaxial silicon growth step is eliminated. Such a mounted power device can be combined and connected to a second chip within a housing, wherein the second chip may comprise a microcontroller or pulse width modulation controller.

Advantages of using the bump-loaf or loaf bump flip-chip to lead-frame fabrication technique, according to the teachings of this disclosure are: 1) wafer-level-chip-scale-package solutions, 2) multiple power-FETs can be interconnected in a single package, 3) the semiconductor power die can incorporate both the source and the drain contacts on one face of the die since the lead-frame carries and distributes the device operating current.

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic plan view of a semiconductor power device and a plan view of a lead-frame, according to a specific example embodiment of this disclosure. A power semiconductor die 102 comprises gate (G), drain (D) and source (S) bump metal fingers 110 on which a plurality of electrically conductive ball bumps 104, 106, 108 are in physical and electrical communications, e.g., connected, coupled, etc., therewith. The bump metal fingers 110 can be formed by a patterned metal layers deposited on the top of the interconnect metal layers, for example, on the top of the second metal layer. For example, the source and drain regions will be connected to metal runners on a first metal layer, then a second layer of metal will form wider metal runners that will be where the bump metal of the top contacts will be deposited.

In summary, the drain and source areas will connect through standard interconnect technology to a final metal layer. An insulating layer will be deposited, and openings in the insulating layer over the final metal layer will be created to allow the bump metal to contact the final layer of metal.

The ball bumps on the gate element are represented by the numeral 104. The ball bumps on the source elements are represented by the numeral 106 and the ball bumps on the drain elements are represented by the numeral 108. The ball bumps may comprise solder ball bumps, conductive epoxy ball bumps, etc. Each gate, source and drain group of the plurality of ball bumps are arranged in a "bump loaf" configuration on each of the respective semiconductor device gate, source and drain elements. However, only the source and drain bump metal fingers require a high number of ball bumps to provide for a very low connection resistance. Thus, the gate finger could have less ball bumps. For example, the gate are may only use a single ball pump as no high currents will flow through it. However, it may be more practical to provide each finger with the same number of ball bumps and the ball bumps may preferably form a matrix as can be seen in FIG. 1.

A lead-frame 104 having a conductive frame and lead-fingers is adapted to receive and come in contact with the plurality of ball bumps of the power semiconductor die 102 in a "flip-chip" configuration. The lead-frame 104 shown in FIG. 1 is depicted in a "final state," in other words, any possible support joints between the fingers have been removed. A gate lead-finger 204 connects to the gate ball bumps 104, source lead-fingers 206 connect to the source ball bumps 106, and drain lead-fingers 208 connect to the drain ball bumps 108. The lead fingers are elongated strips of metal corresponding in length to the runners on the chip 102. Thus, these fingers are arranged alternatively as source and drain fingers shown in FIG. 1. A connection strip arranged on one side, for example the right side, connects all drain fingers to form drain contact element 208 and correspondingly, a connection strip on the other side, for example the left side, connects all source fingers to form source contact element 206. Thus, an inter-digital structure is formed as shown in FIG. 1. A single gate finger 204 can be arranged on either side of this structure.

Other structures than this inter-digital structure may be used wherein a plurality of fingers or areas that can receive a plurality of ball bumps for the source and drain contact elements are provided. For example, a circular or square ring-shaped structure with alternating drain and source rings may be used. The source and drain fingers may not be arranged alternately but rather in groups. More than a single gate finger may be provided.

Solder ball bumps attach to the lead-frame 104 through heating the lead-frame 104 and die 102 to a temperature sufficient to melt the ball bump solder. Conductive epoxy ball bumps attach to the lead-frame 104 heating B-staged epoxy ball bumps on the die 102 sufficiently to C stage them to the lead-frame 104. Thereafter the assembly comprising the die 102 and the lead-frame 104 may be packaged or used as an unpackaged lead-frame device. As mentioned above any support structures in the lead-frame 104 that electrically connect certain elements can be removed at the appropriate manufacturing stage to provide for the proper electrical connections between the lead-frame 104 and the die.

Figure 2B:
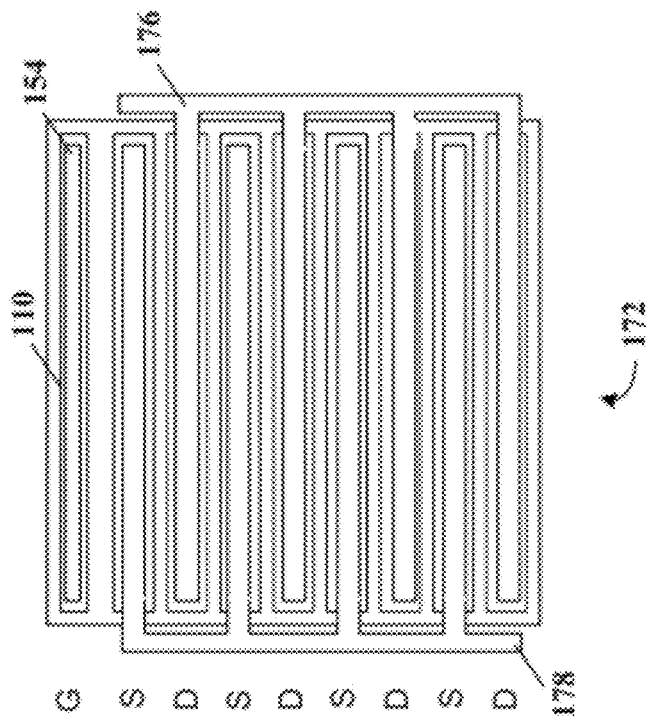
FIGS. 2A and B illustrate further schematic plan views of semiconductor power devices according to further example embodiments.
Figure 2A:
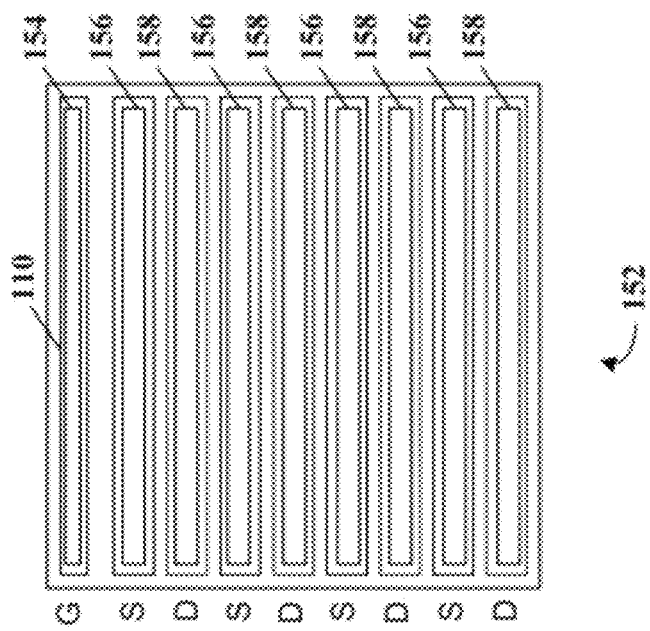

FIG. 2A shows another embodiment in which instead of a plurality of ball bumps a single loaf bump 154, 156, 158 for making electrical contact with a leadframe is placed on each contact element 110 of the semiconductor device 152. Each loaf bump 154, 156, 158 extends along the area of the respective drain, source and gate area. Again, the gate are may only use a single ball pump as no high currents will flow through it. Alternatively, the plurality of ball bumps can be joined to form a single loaf bump on each contact structure. The loaf structure on the gate element is represented by the numeral 154. The loaf structure on the source elements is represented by the numeral 156 and the loaf structure on the drain elements is represented by the numeral 108. Each loaf structure 154, 156, 158 may be formed by an extended solder loaf bump, conductive epoxy loaf bump, etc. Hence, the loaf bump may consist of the same material as the small solder bumps with respect to FIG. 1.

FIG. 2B shows a semiconductor power device 172 for which the contact loaf structures 156 and 158 have been extended by respective side structures connecting the loaf fingers of drain and source, respectively. Thus, loaf structure 176 can be seen as a single contact structure which extends to the right side of the active area of the semiconductor for contact with the drain. Similar the loaf structure 178 extends to the left side to join all source loaf contact structures. The extending loaf structures on the right and left of the fingers may cover respective drain and/or source areas within the active region. However, these connecting structures may also be arranged outside the active area as shown for example in FIG. 2B. The actual semiconductor chip may be larger to support the side contact structures of contact loafs 176 and 178.

FIG. 3 shows a cross section through the die along lines 2-2 in FIG. 1. As can be seen a standard field effect power transistor is formed by a plurality of cells coupled in parallel. A cell can be formed symmetrically as shown in FIG. 3. Here, on a substrate 210 a epitaxial layer 220 is formed. Within the epitaxial layer 220, a cell may be formed by two base regions 230 in which source regions 240 are embedded. In-between the two base regions, a drain region 250 may be formed. For each cell, two gates 260 are formed within an insulation layer on top of the epitaxial layer 220, wherein the gates 260 at least cover a lateral channel region within the base region between the source region 240 and the epitaxial layer 220. Other cells are arranged next to this cell. Also, other cell structures can be used, for example, the base and source region can be symmetrical so that a base region can also be used for a neighboring cell. As discussed above, a two metal layer structure can be used to interconnect the source, drain, and gate of each transistor of each cell with the bump metal fingers 275, 285, 295 as schematically shown in FIG. 3. The first metal layer provides for narrow contact to the source and drain regions and also provides for interconnection of the gates. The second metal layer is used to connect the first metal layer structures with the respective bump metal fingers 275, 285, 295 by means of wider openings.

Figure 4:
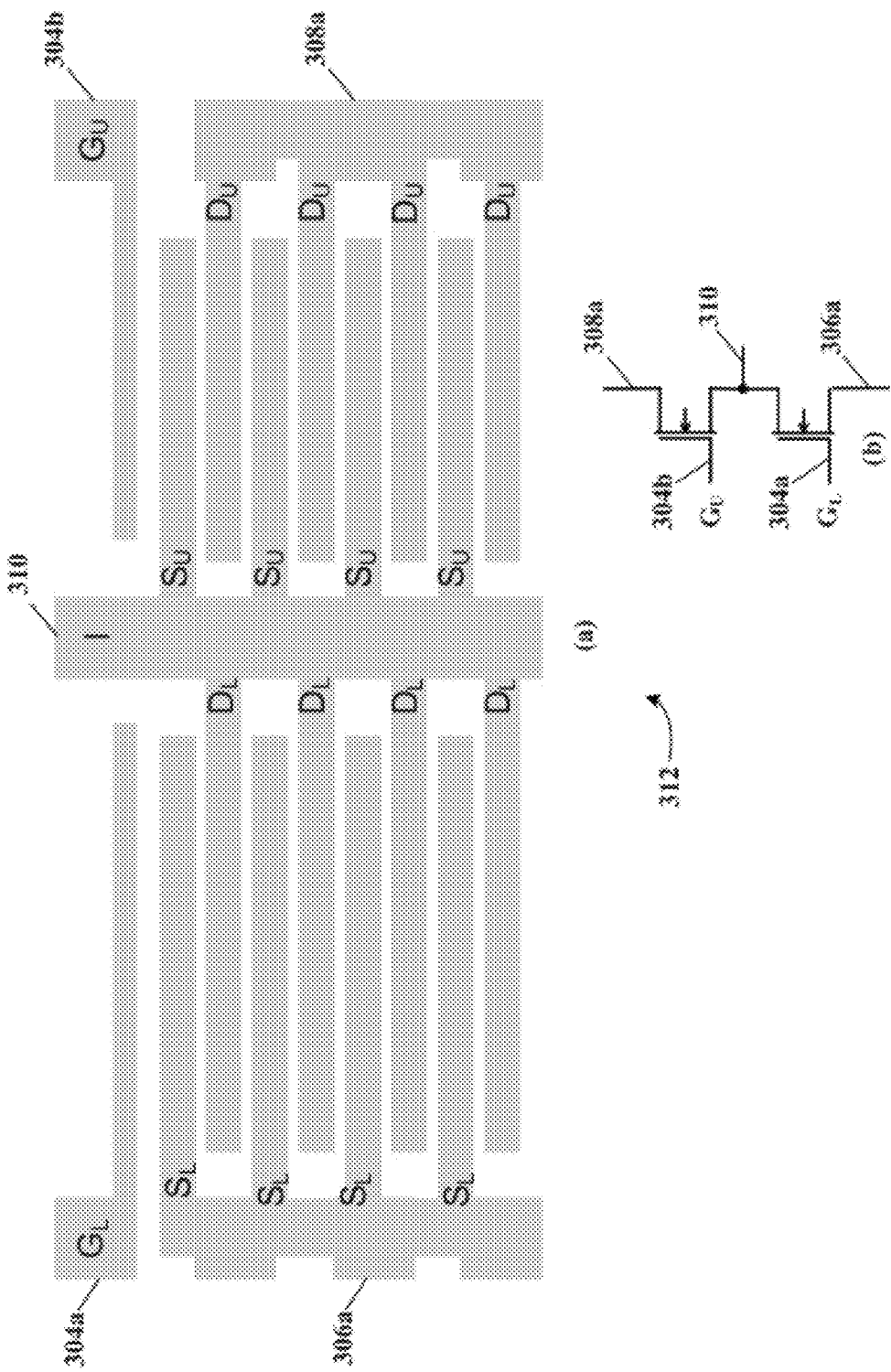
FIG. 4 illustrates a schematic plan view of a lead-frame configured for a plurality of semiconductor power devices shown in FIGS. 1 and 2A and a schematic diagram of cascode connected power field effect transistors, according to another specific example embodiment of this disclosure.

Referring now to FIG. 4, depicted is a schematic plan view of a lead-frame configured for connection of a plurality of semiconductor power devices shown in FIG. 1 or 2A and a schematic diagram of cascode connected power field effect transistors, according to another specific example embodiment of this disclosure. A lead-frame 312 comprises a plurality of interconnected lead-fingers sufficient for connecting to at least two semiconductor power devices, lead-frame shown in (a) for two dice 102 or for a single dice comprising two transistors. An electrical schematic interconnection diagram of the two semiconductor power devices is shown at (b).

Figure 5C:
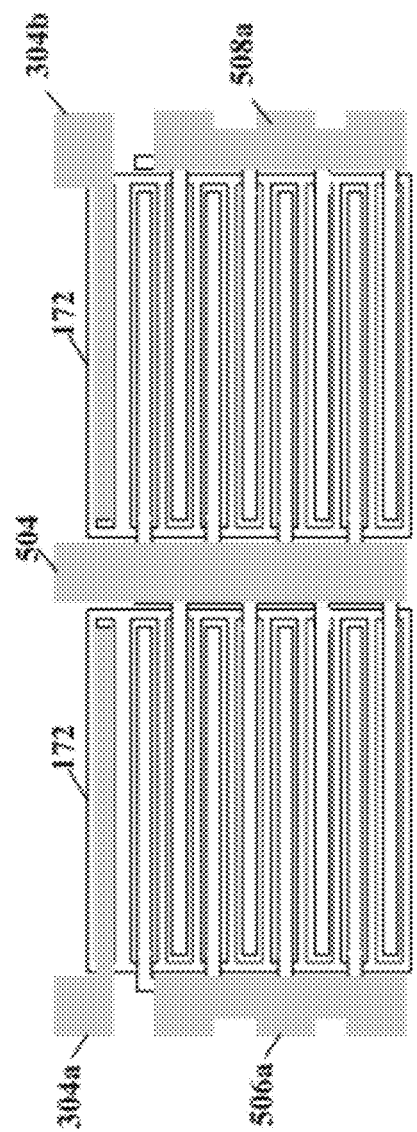

FIGS. 5A-C show examples of mounted semiconductor power chips on a lead-frame according to FIGS. 1-3. In FIG. 5A two separate power semiconductor chips 102 or 152 formed according to FIG. 1 or 2A are placed on the lead-frame. Each device is thus insulated from the other device. FIG. 4B shows an example with a single chip 430 formed according to the principles shown in FIGS. 1 and 2A covering both inter-digital source-drain-gate contact areas. Thus, the chip 430 must provide for insulated devices within the epitaxial layer. This could be done by providing each transistor in its own designated well as otherwise the drains of each device would be shorted.

FIG. 5C shows an example of a leadframe structured for an embodiment of a semiconductor power device as shown in FIG. 2B. Here, no "interdigital leadframe fingers" for the drain and source contact regions are necessary because the extended contact areas on the right and left side already provide for the electrical connection of these areas, respectively as discussed with respect to FIG. 2B. Thus, leadframe contact areas 310, 306a and 308a can each be formed by a single strip 504, 506a, 508a, respectively as shown in FIG. 5C. The contact leadframe structure for the gate remains the same as the one shown in FIGS. 5A and B. However, according to another embodiment, the gate may have a contact structure 154 that extends to the right and/or left similar as the structures 176 and 178 shown in FIG. 5C.

Figure 6:
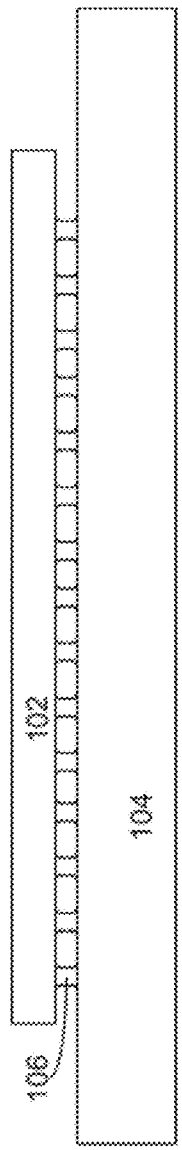
FIG. 6 shows a cross section of a mounted power semiconductor chip on a lead-frame.

FIG. 6 shows a cross sectional view of a mounted power transistor chip 102 on a lead-frame 104 using solder bumps 106. The sectional view is taken through a source finger and after bonding and before packaging.

Figure 7:
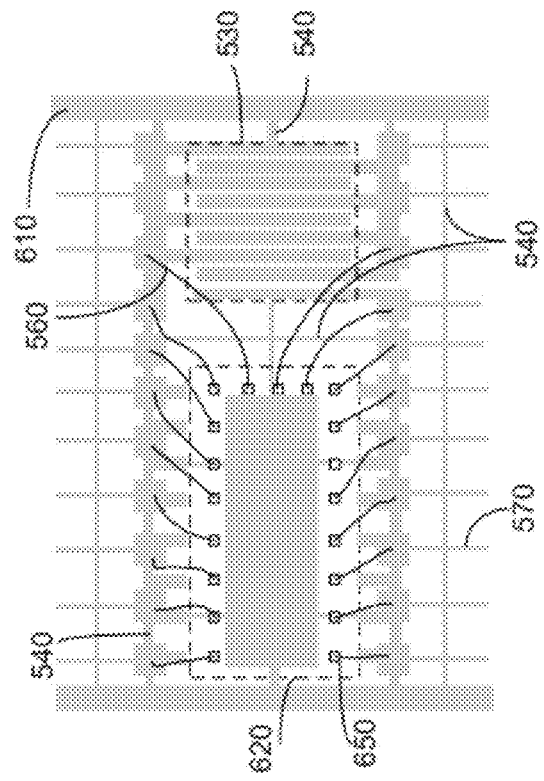
FIGS. 7-9 show various examples of single and multiple chips mounted on a lead-frame.

FIG. 7 shows a first example of a chip 530 mounted on a lead-frame 510 as explained above. The lead-frame may have a plurality of external pins 570, in the shown example 8 pins. The power transistor chip 530 shown uses four pins 570 for the drain connection and three pins 570 for the source connection. A single pin is used for the gate connection. For mounting purposes and before encapsulation, the lead-frame may comprise a plurality of support connections, three of which are referenced by reference symbol 540. The pins 570 for the external connection may be single pins or form a group of connected pins as shown in FIG. 7. Thus, any support connection between these pins within a group may remain. Also according to other embodiments, wider pins may be used for the source drain connection to support a higher current.

Certain applications of control circuits, in particular microcontroller applications, require the control of power transistors, for example, switch mode power supply controllers, buck converters or motor control applications. Such applications therefore use generally separate discrete power transistors. According to various embodiments, a pulse width modulator or even a microcontroller can be packaged together with a power transistor as described above.

Figure 8:
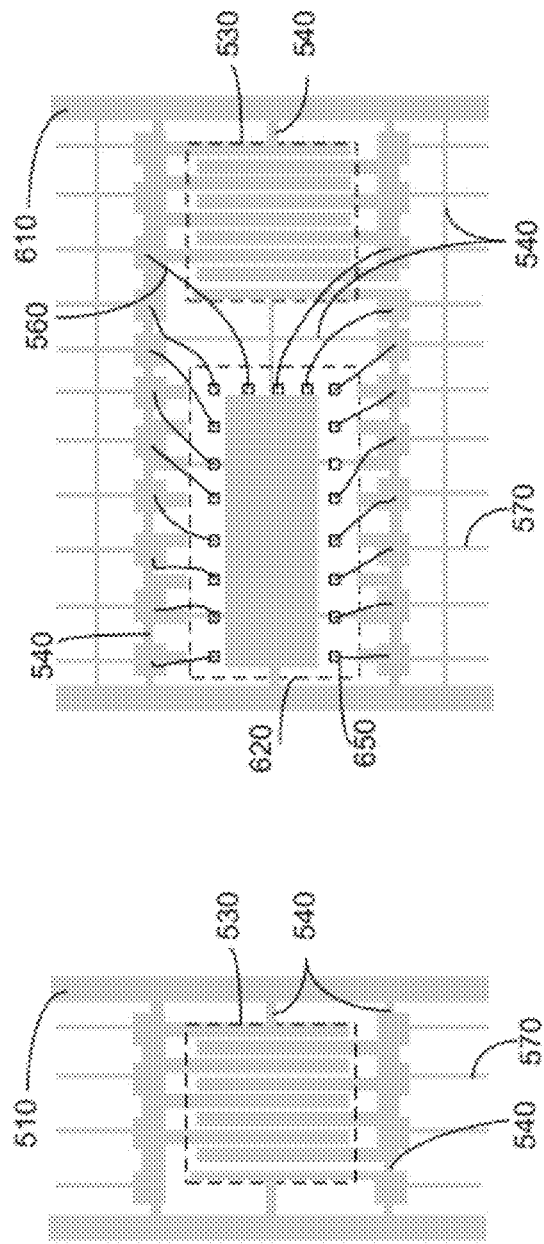

FIG. 8 shows an example of a lead-frame 610 that can support a first chip 620, for example a microcontroller chip, coupled to the lead-frame 610 in conventional bonding technique and a second chip 530 comprising one a power transistor as described above and mounted to the lead-frame using the above mentioned flip chip bump bonding technique. Reference symbol 570 again indicates an external pin of the lead-frame 510. Lead-frame 610 is furthermore shown in FIG. 8 with a plurality of support connections, four of them indicated by reference symbol 540. As mentioned above, these support structures are cut out before enclosing the device in a housing to eliminate any unwanted shorts in the frame and proper connection to the designated pin 570. As shown the first chip 620 can be interconnected to at least one of the source, drain and gate fingers at appropriate connection points on the lead-frame 610. While the first chip 620 uses single pins 570 for each connection to a bond pad 650, the section of the lead-frame for the second chip may again connect multiple pins 570 to each source and drain connection to provide a low resistance and support for high currents. However, other external pins, for example, wider pins may be used for the source and/or drain contacts of the second chip 530 according to various embodiments. As mentioned above, the first chip 520 can be a pulse width modulation device, a controller or a microcontroller operable to directly interface with a power transistor. To this end, these devices have integrated drivers that are capable of directly driving the gate of the power transistor.

Figure 9:
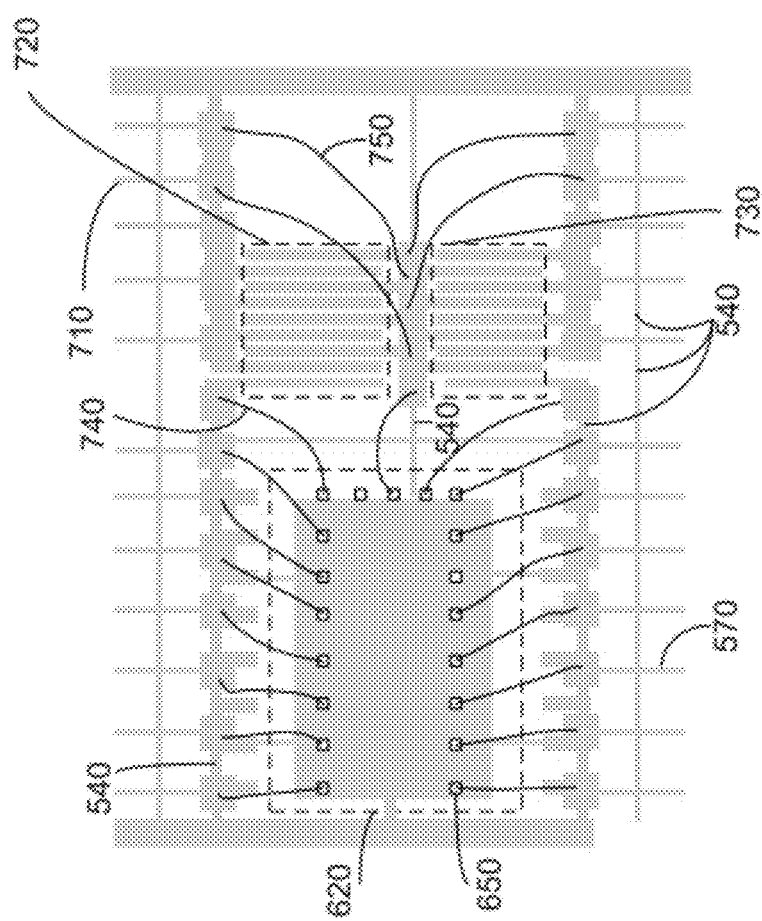

FIG. 9 shows yet another embodiment comprising a lead-frame 710 with a microcontroller chip 620 connected by standard wire-bonding and two power transistor chips 720 and 730 mounted in flip chip technology as explained above. The section with the two power transistors corresponds to the lead-frame shown in FIG. 3. Here, additional external pins 710 are provided in comparison with FIG. 8 for coupling with the interconnected source-drain section 310 via bonding wires 750. Any source, drain and/or gate of the two transistor chips 720, 730 may be connected to a bond pad 650 via a bond wire 740 of the microcontroller chip 620 as exemplarily shown in FIG. 9. Again, FIG. 9 shows a plurality of support structures 540 that will be removed before encapsulation.

The embodiments shown in the various figures are not restricted to field effect transistors but may also be used for any type of bipolar transistor structure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A semiconductor power chip, comprising:
   a semiconductor die having a power device fabricated on a substrate thereof, wherein the power device comprises at least one first contact element, a plurality of second contact elements and a plurality of third contact elements arranged on top of said semiconductor die, wherein the first, second and third contact elements are arranged in parallel and each has the form of an elongated strip;

a loaf bump disposed on each of the plurality of second contact elements and the plurality of third contact elements wherein each loaf bump extends substantially over a respective surface area of the plurality of second contact elements and the plurality of third contact elements; and at least one ball bump or loaf on the at least one first contact element.

2. A semiconductor power chip according to claim 1, wherein the first contact element is a gate contact element, the second contact element is a source contact element, and the third contact element is a drain contact element.

3. A semiconductor power chip according to claim 1, wherein each elongated strip substantially extends between two opposing sides of the semiconductor die.

4. A semiconductor power chip according to claim 1, further comprising a plurality of first contact elements wherein each first contact element comprises a plurality of ball bumps.

5. A semiconductor power chip according to claim 1, further comprising a plurality of first contact elements wherein each first contact element comprises a loaf bump extending substantially along the first contact element.

6. A semiconductor power device, comprising a semiconductor power chip according to claim 2, further comprising:

a lead-frame having an area comprising gate, source and drain lead-fingers adapted to match up with the plurality of ball bumps or the loaf bump for connecting to each of the at least one gate contact element, the plurality of source contact elements and the plurality of drain contact elements.

7. The semiconductor power device according to claim 6, wherein each lead finger has the form of an elongated strip.

8. The semiconductor power device according to claim 7, wherein the leadframe further comprises left and right connection elements that interconnect the drain and source lead fingers, respectively.

9. The semiconductor power device according to claim 8, wherein the drain and source lead fingers are arranged alternatively to form a inter-digital structure.

10. The semiconductor power device according to claim 6, further comprising a plurality of ball bumps disposed on the at least one gate contact element.

11. The semiconductor power device according to claim 6, further comprising a loaf bump disposed on the at least one gate contact element.

12. A semiconductor power device, comprising at least a first and second semiconductor power chip, each semiconductor power chip being formed according to claim 2, further comprising:

a lead-frame having an first and second area each first and second area comprising gate, source and drain lead-fingers adapted to match up with the plurality of ball bumps or the loaf bump for connecting to each of the at least one gate contact element, the plurality of source contact elements and the plurality of drain contact elements of said first and second semiconductor chips, respectively.

13. The semiconductor power device according to claim 12, wherein each lead finger has the form of an elongated strip.

14. The semiconductor power device according to claim 12, wherein the leadframe further comprises left and right connection elements for each of said first and second power semiconductor chips that interconnect the drain and source lead fingers, respectively.

15. The semiconductor power device according to claim 14, wherein the drain and source lead fingers are arranged alternatively to form a inter-digital structure.

16. The semiconductor power device according claim 12, wherein the lead-frame also connects together a source of said first semiconductor chip and a drain of said second semiconductor chip.

17. The semiconductor power device according to claim 12, further comprising a plurality of ball bumps disposed on the at least one gate contact element.

18. The semiconductor power device according to claim 12, further comprising a loaf bump disposed on the at least one gate contact element.

19. A semiconductor device comprising a semiconductor power chip according to claim 2, further comprising:

another chip;

a lead-frame having a first area comprising gate, source and drain lead-fingers adapted to match up with the plurality of ball bumps or loaf bumps for connecting to each of the at least one gate contact element, the plurality of source contact elements and the plurality of drain contact elements of the semiconductor power chip and a second area configured for wire bonding said another chip.

20. The semiconductor power device according to claim 19, wherein each lead finger has the form of an elongated strip.

21. The semiconductor power device according to claim 20, wherein the leadframe further comprises left and right connection elements that interconnect the drain and source lead fingers, respectively.

22. The semiconductor power device according to claim 21, wherein the drain and source lead fingers are arranged alternatively to form a inter-digital structure.

23. The semiconductor device according to claim 19, further comprising a plurality of ball bumps or a loaf bump disposed on the at least one gate contact element.

24. The semiconductor device according to claim 19, wherein the another chip is a microcontroller chip operable to control said semiconductor power chip.

25. The semiconductor device according to claim 19, wherein the another chip is a pulse width modulation chip operable to control said semiconductor power chip.

26. A semiconductor device comprising at least a first and second semiconductor power chip, each semiconductor power chip being formed according to claim 2, further comprising:

a third chip;

a lead-frame having an first and second area each first and second area comprising gate, source and drain lead-fingers adapted to match up with the plurality of ball bumps or the loaf bumps for connecting to each of the at least one gate contact element, the plurality of source contact elements and the plurality of drain contact elements of said first and second semiconductor chips, respectively and a third area configured for wire bonding said another chip.

27. The semiconductor power device according to claim 26, wherein each lead finger for said first and second semiconductor power chip has the form of an elongated strip.

28. The semiconductor power device according to claim 27, wherein the leadframe further comprises for each of said first and second semiconductor power chips left and right connection elements that interconnect the drain and source lead fingers, respectively.

29. The semiconductor power device according to claim 28, wherein the drain and source lead fingers are arranged alternatively to form a inter-digital structure.

30. The semiconductor device according to claim 26, further comprising a plurality of ball bumps or a loaf bump disposed on the at least one gate contact element.

31. The semiconductor device according to claim 26, wherein the third chip is a microcontroller chip operable to control said semiconductor power chip.

32. The semiconductor device according to claim 26, wherein the third chip is a pulse width modulation chip operable to control said semiconductor power chip.

33. A semiconductor power chip, comprising:
a semiconductor die having a power device fabricated on a substrate thereof, wherein the power device comprises at least one first contact element, a plurality of second contact elements and a plurality of third contact elements arranged on top of said semiconductor die, wherein the first, second and third contact elements are arranged in parallel and each has the form of an elongated strip;
a plurality of loaf bumps, each loaf bump disposed on one of the plurality of second elements and on one of the plurality of third elements; wherein the loaf bumps for the second contact elements extend towards one side of the semiconductor die and are joined by a first loaf side structure and the loaf bumps for the third contact elements extend towards the other side of the semiconductor die and are joined by a second loaf side structure;
at least one ball bump or loaf on the at least one first contact element.

34. A semiconductor power chip according to claim 33, wherein the first contact element is a gate contact element, the second contact element is a source contact element, and the third contact element is a drain contact element.

35. A semiconductor power device, comprising a semiconductor power chip according to claim 33, further comprising:
a lead-frame having a first area for contact with the first contact element, a second area for contact with the first loaf side structure and a third area for contact with the second loaf side structure.

36. A semiconductor power device, comprising a semiconductor power chip according to claim 35, wherein the lead-frame does not substantially cover the second and third contact elements.

37. A semiconductor power chip according to claim 33, wherein each elongated strip substantially extends between two opposing sides of the semiconductor die.

\* \* \* \* \*